United States Patent
Enns et al.

(10) Patent No.: US 11,461,943 B1
(45) Date of Patent: Oct. 4, 2022

(54) MOSAIC DISPLAY SYSTEMS AND METHODS FOR INTELLIGENT MEDIA SEARCH

(71) Applicant: Shutterstock, Inc., New York, NY (US)

(72) Inventors: Gavin Enns, Toronto (CA); Mark Allen Sherrill, New York, NY (US); Wyatt Jenkins, Brooklyn, NY (US); William Kris Arnold, New York, NY (US)

(73) Assignee: Shutterstock, Inc., New York, NY (US)

( * ) Notice: Subject to any disclaimer, the term of this patent is extended or adjusted under 35 U.S.C. 154(b) by 23 days.

(21) Appl. No.: 16/751,059

(22) Filed: Jan. 23, 2020

Related U.S. Application Data

(63) Continuation of application No. 15/968,002, filed on May 1, 2018, now Pat. No. 10,546,404, which is a
(Continued)

(51) Int. Cl.
*G06F 17/00* (2019.01)
*G06T 11/60* (2006.01)
(Continued)

(52) U.S. Cl.
CPC .......... *G06T 11/60* (2013.01); *G06T 3/4038* (2013.01); *G06F 30/13* (2020.01); *G06F 30/39* (2020.01);
(Continued)

(58) Field of Classification Search
CPC ...... G06F 40/103; G06F 30/392; G06F 30/13; G06F 30/39; G06F 40/106; G06T 11/60; G06T 3/4038
(Continued)

(56) References Cited

U.S. PATENT DOCUMENTS

| 6,414,698 B1 * | 7/2002 | Lovell | G06F 9/451 |
| | | | 715/800 |
| 6,603,493 B1 * | 8/2003 | Lovell | G06F 9/451 |
| | | | 715/800 |

(Continued)

OTHER PUBLICATIONS

WikiPedia, "Bin Packing Problem," archived Feb. 27, 2010, download from <"https://web.archive.org/web/20100227202613/https://en.wikipedia.org/wiki/Bin_packing_problem">, 3 pages.

*Primary Examiner* — Cesar B Paula
*Assistant Examiner* — James H. Blackwell
(74) *Attorney, Agent, or Firm* — McDermott Will & Emery LLP

(57) ABSTRACT

A method and system for displaying a dynamic mosaic of media files, the method comprising: receiving media files, determining a fill direction, constructing a layout, determining an edge set from the media files previously placed on the layout, determining a trailing edge, and adjacent edges, constructing a set of closed rectangles an open rectangle from the trailing edge and adjacent edges, providing a first set of frames by iteratively attempting to fill up to one closed rectangle from the set of closed rectangles, providing a second set of frames by filling the open rectangle by placing one searched media file in the open rectangle if no closed rectangle in the set of closed rectangles can be filled, and inserting one of the first set of frames and the second set of frames into a current layout before updating a current edge set based on the inserted frames.

20 Claims, 11 Drawing Sheets

Related U.S. Application Data continuation of application No. 14/109,134, filed on Dec. 17, 2013, now Pat. No. 9,996,957.

(60) Provisional application No. 61/747,327, filed on Dec. 30, 2012.

(51) Int. Cl.
  *G06T 3/40*    (2006.01)
  *G06F 40/106*  (2020.01)
  *G06F 40/103*  (2020.01)
  *G06F 30/13*   (2020.01)
  *G06F 30/392*  (2020.01)
  *G06F 30/39*   (2020.01)

(52) U.S. Cl.
  CPC .......... *G06F 30/392* (2020.01); *G06F 40/103* (2020.01); *G06F 40/106* (2020.01)

(58) Field of Classification Search
  USPC ....................................................... 715/247
  See application file for complete search history.

(56) References Cited

U.S. PATENT DOCUMENTS

| | | | |
|---|---|---|---|
| 6,901,378 B1 | 5/2005 | Linker et al. | |
| 7,177,488 B2* | 2/2007 | Berkner | G06F 16/9577 382/298 |
| 7,484,182 B1* | 1/2009 | Smith | G06F 3/0481 715/794 |
| 7,735,007 B2 | 6/2010 | Altman et al. | |
| 7,797,377 B2 | 9/2010 | Linker et al. | |
| 7,917,859 B1 | 3/2011 | Singh et al. | |
| 8,046,717 B1 | 10/2011 | Goel et al. | |
| 8,078,969 B2 | 12/2011 | Harrison | |
| 8,132,116 B1* | 3/2012 | Schendel | G06F 3/04817 715/764 |
| 8,144,995 B2 | 3/2012 | Thompson | |
| 8,200,039 B2 | 6/2012 | Jin et al. | |
| 8,224,119 B2 | 7/2012 | Jin et al. | |
| 8,605,119 B1* | 12/2013 | Bankhead | G06F 16/9577 345/660 |
| 9,269,323 B2 | 2/2016 | Edmiston et al. | |
| 9,449,411 B2* | 9/2016 | Cok | G06T 11/60 |
| 2003/0028560 A1* | 2/2003 | Kudrolli | G06F 40/18 715/273 |
| 2008/0205789 A1 | 8/2008 | Ten Kate et al. | |
| 2009/0064029 A1* | 3/2009 | Corkran | G06F 3/0482 715/781 |
| 2009/0138817 A1* | 5/2009 | Oron | G06F 16/9577 715/788 |
| 2009/0327965 A1* | 12/2009 | Averett | G06F 3/04842 715/835 |
| 2010/0269037 A1* | 10/2010 | Atkins | G09G 5/14 715/244 |
| 2010/0277754 A1 | 11/2010 | Arimura et al. | |
| 2011/0074824 A1 | 3/2011 | Srinivasan et al. | |
| 2012/0054649 A1 | 3/2012 | McDonald et al. | |
| 2012/0275704 A1* | 11/2012 | Cok | H04N 1/00196 382/190 |
| 2013/0106913 A1* | 5/2013 | Edmiston | G06F 3/14 345/660 |

* cited by examiner

MOSAIC DISPLAY SYSTEMS AND METHODS FOR INTELLIGENT MEDIA SEARCH

CROSS-REFERENCE TO RELATED APPLICATIONS

The present application is a continuation of U.S. patent application Ser. No. 15/968,002, filed on May 1, 2018, now U.S. Pat. No. 10,546,404, which is a continuation of U.S. patent application Ser. No. 14/109,134, now U.S. Pat. No. 9,996,957, filed on Dec. 17, 2013, which claims the benefit of priority under 35 U.S.C. § 119 from U.S. Provisional Application No. 61/747,327 entitled "MOSAIC IPAD IMPLEMENTATION," filed on Dec. 30, 2012, the disclosures of which are hereby incorporated by reference in their entirety, for all purposes.

BACKGROUND

1. Field of Disclosure

The present disclosure generally relates to a media search and retrieval system, and, more particularly, to systems and methods for rapid retrieval of searched media files that uses a first database containing suggested search terms and associated pointers to media files in a second database for autocompleting user requests.

2. Brief Description of Related Art

Grid image design is a complex problem for creation of web pages across browsers. One fundamental problem in designing an image grid is that most web interface display systems are designed for displaying a text file. These display systems, often process images files and text files in the same manner. For example, when an image is displayed by default in line with the text, the existing display systems often leave a blank line or space at the bottom for descendenders (such as found in the letters "j," "g," and "y"), even though, typically, an image will not have the abovementioned blank lines. Although some browsers account for this situation, the practice of taking into account the differences between displaying a text file and an image file is still not a standard practice in the industry. Several other technical issues may arise while displaying images on the web interfaces. Among them are having an asymmetrical balance while displaying images of different sizes on a single page, a decrease in latency of image display by the user, causing simultaneous display of multiple images, incorporating the thumbnail generation technology in displaying images, optimization of space in an image grid gallery and maintenance of consistency of visual hierarchy across devices and browsers. These technical issues are discussed in detail below.

The technique of asymmetrical display layout involves evenly distributing image elements within a grid format, which may involve balancing a large photograph with several small photographs. Uneven elements often present several potential possibilities for arranging the elements on the page and creating interesting layout designs rather than displaying a page containing a layout of perfectly symmetrical objects. Asymmetrical layouts are generally more dynamic, and by intentionally ignoring balance, the designer can create tension, express movement, or convey a mood such as anger, excitement, joy, or casual amusement. There inevitably is a certain latency time between the times the user enters a command by way of an I/O device (e.g. keyboard, IR remote control unit) to view a selected image, and the time when the selected image actually appears on the display screen. This latency time is largely due to the time required for locating the image data, reading the image data, and then loading the read-out image data into the image memory or in the client system display. Typically, this latency time could be as much as 1 to 4 seconds, or long enough to be noticeable and inconvenient to the user. It would be desirable to minimize this latency time, such that the latency time is barely noticeable to the user.

Some user interface applications of image display systems involve displaying multiple images, for instance for side-by-side comparison. For instance, medical imaging applications and slide presentations are two applications in which the display of two or more images in a side-by-side format can be useful. Also, consumers may want to compare images side-by-side, for instance, to select a preferred one of several portrait photos of the same person. In addition, users may wish to browse through a large library of images to select a plurality of images for display and download.

Although similarity-based visualization can help users find the right image quickly, especially for web images search results, some hurdles still need to be crossed in order to enable users to really enjoy the instantaneous and seamless display of the searched images. One problem in using similarity-based image visualization technique is difficulty in identifying an effective tool to measure the similarity between two images. Another problem is information loss caused by image down-sampling when an attempt is made to place more images on a single screen. Accordingly, a better thumbnail generation technology, other than directly down-sampling the searched images is needed to efficiently use the user interface space to effectively display the searched images.

There are several software image grid galleries that support dynamic width and height images. Among software packages that support these image galleries are jQuery Masonry, Tympanus Automatic Image Montage and CSS-Tricks Seamless Responsive Photo Grid, but each software package has limitations. For example, Jquery Masonry allows for both width and height to be dynamic, but generates gaps between images. While the remaining software packages create aesthetically pleasing grids, these software packages hold either image width or image height as a static variable. Masonry is a dynamic grid layout plugin for jQuery, which can be considered as the flip-side of CSS floats. The CSS floating method arranges image elements horizontally on the user interface, before arranging the image elements vertically on the user interface. However, Masonry method arranges image elements vertically, positioning each image element in the next open spot in the grid. The resulting arrangement of image elements on the user interface minimizes vertical gaps between image elements of varying height, like a mason fitting stones in in a horizontal line on a wall.

The software package Isotope supporting dynamic visual sorting of images of chemical isotopes in a grid overcomes some of these limitations. However, Isotope does not support packing of images of different orientations together without gaps or reordering.

The first step in image management is to set max-width to 100% and let the height of the image adjust, which simultaneously maintains the aspect ratio of the image. This, however, may introduce problems with maintaining the image hierarchy. For example, when a width aspect ratio of a banner image is squeezed down to fit a narrow column, the resulting image loses its previously designated position in the visual hierarchy of the page upon which the banner image is displayed. Thus, normally smaller inline images may appear larger, which in turn may result in inverting the visual hierarchy of the page. Because adaptability is based on the image width, horizontal images may require more scaling than vertical images. This can lead to a problem where scale between images can change. A horizontal image that is larger and more dominant in the visual hierarchy of the page displayed on a wide screen browser, may very well end up being displayed as a smaller and less dominant image on the narrow screen of a mobile device.

Both U.S. Pat. No. 8,200,039 B2 and U.S. Pat. No. 8,224,119 B2 teach stitching images together to form a mosaic or collage format displayed in a grid. U.S. Pat. No. 8,046,717 B1 teaches generating thumbnail images from rich content, where the thumbnail images can be combined in the form of a collage. U.S. Pat. No. 7,917,859 teaches generation of a photo collage and using weighted values associated with thumbnail images to rank relevancy of thumbnail images. U.S. Pat. No. 8,144,995 B2 teaches display of searched images in a grid format which has an appearance of a mosaic or collage. U.S. Pat. No. 7,797,377 B2 teaches a system for displaying a product associated with a media object such as image file, an audio file, and a video file, where the system is integrated with the user's preferences for the product. The patent further teaches an automatic display of a collage or mosaic display. U.S. Pat. No. 6,901,378 B1 teaches a collage or mosaic display of thumbnail photos based on a search and retrieval of relevant images based on metadata while integrating users' preferences for the product.

US 2010/0277754 A1 discloses an apparatus for generating a mosaic image, where a single image is obtained and segmented into a plurality of blocks according to density values for the basic colors. US 2012/0054649 A1 discloses a method and system for displaying images in a mosaic or collage format along a grid. US 2009/0064029 A1 discloses a method for displaying multiple digital objects such as images displayed in a matrix and scored on the matrix based on relevancy, and the more relevant images are located centrally to a viewer and the less relevant ones are located spatially outward. US 2008/0205789 A1 discloses a method for providing photo collage where one embodiment is displayed in tiles. The display is dynamic using digital frames where the photo is changed based on the user input. US 2011/0074824A1 discloses a display of images in a mosaic or collage where the image's aspect ratio is preserved. U.S. Pat. No. 8,078,969 B2 discloses a method for manipulation of image dimensions by the user in the image receiving area for displaying images in a collage format. U.S. Pat. No. 7,735,007 teaches methods for adding a removal of white spaces from a document as images are added to the document, by growing and shrinking the electronic page size.

However, the aforementioned patents fail to fit together as many large images as possible in a browser window without disrupting the order of images resulting for various types of image sorts. Images are displayed as search results in the disclosed method, like any other search results, images may also be sorted by relevance, popularity, etc. Resultantly, a user can view an interface displaying more image pixels and displaying images with fewer gaps between the images. The disclosed method is compatible with various image sorting methods. For example, the disclosed method may support sorting methods including but not limited to the popular sort, relevancy sort, sort displaying newly searched images, and random sort, etc.

3. BRIEF SUMMARY

By way of introduction only, the present invention provides methods and systems for displaying a dynamic mosaic of media files on a user interface of a computing device, the method comprising: receiving a set of searched media files which are to be placed on an empty space on the user interface, determining a fill direction in which the media files are to be placed on the empty space, constructing a layout, determining an edge set from the media files previously placed on the layout, determining a trailing edge, and between zero and two adjacent edges, constructing a set of closed rectangles consisting up to two closed rectangles and an open rectangle from the trailing edge and adjacent edges, providing a first set of frames by iteratively attempting to fill up to one closed rectangle from the set of closed rectangles by placing at least one media file in up to one closed rectangle, providing a second set of frames by filling the open rectangle by placing one searched media file in the open rectangle if no closed rectangle in the set of closed rectangles can be filled, and inserting one of the first set of frames and the second set of frames into a current layout before updating a current edge set based on the inserted frames. The foregoing discussion of the preferred embodiments has been provided only by way of introduction. Nothing in this section should be taken as a limitation of the claims, which define the scope of the invention.

4. BRIEF DESCRIPTION OF SEVERAL VIEWS OF THE DRAWINGS

5. DETAILED DESCRIPTION OF THE PRESENTLY PREFERRED EMBODIMENTS

The present disclosure describes a computer implemented image search system for rapid retrieval of media files, the system is configured to: receive a set of searched media files which are to be placed on an empty space on the user interface, determine a fill direction in which the media files are be placed on the empty space, construct a layout, determine an edge set from the media files previously placed on the layout, determine a trailing edge, and between zero and two adjacent edges, construct a set of closed rectangles consisting up to two closed rectangles and an open rectangle from the trailing edge and adjacent edges, provide a first set of frames by iteratively attempting to fill up to one closed rectangle from the set of closed rectangles by placing at least one media file in up to one closed rectangle, provide a second set of frames by filling the open rectangle by placing one searched media file in the open rectangle if no closed rectangle in the set of closed rectangles can be filled, and insert one of the first set of frames and the second set of frames into a current layout before updating a current edge set based on the inserted frames.

By way of introduction only, the present embodiments provide methods and systems for displaying a list of images of varying dimensions and aspect ratios in a Mosaic pattern of images, where each image may have different dimensions. Additionally, the disclosed embodiments also avail a method for removing white spaces between the various images that are displayed on the Mosaic.

Figure 1:
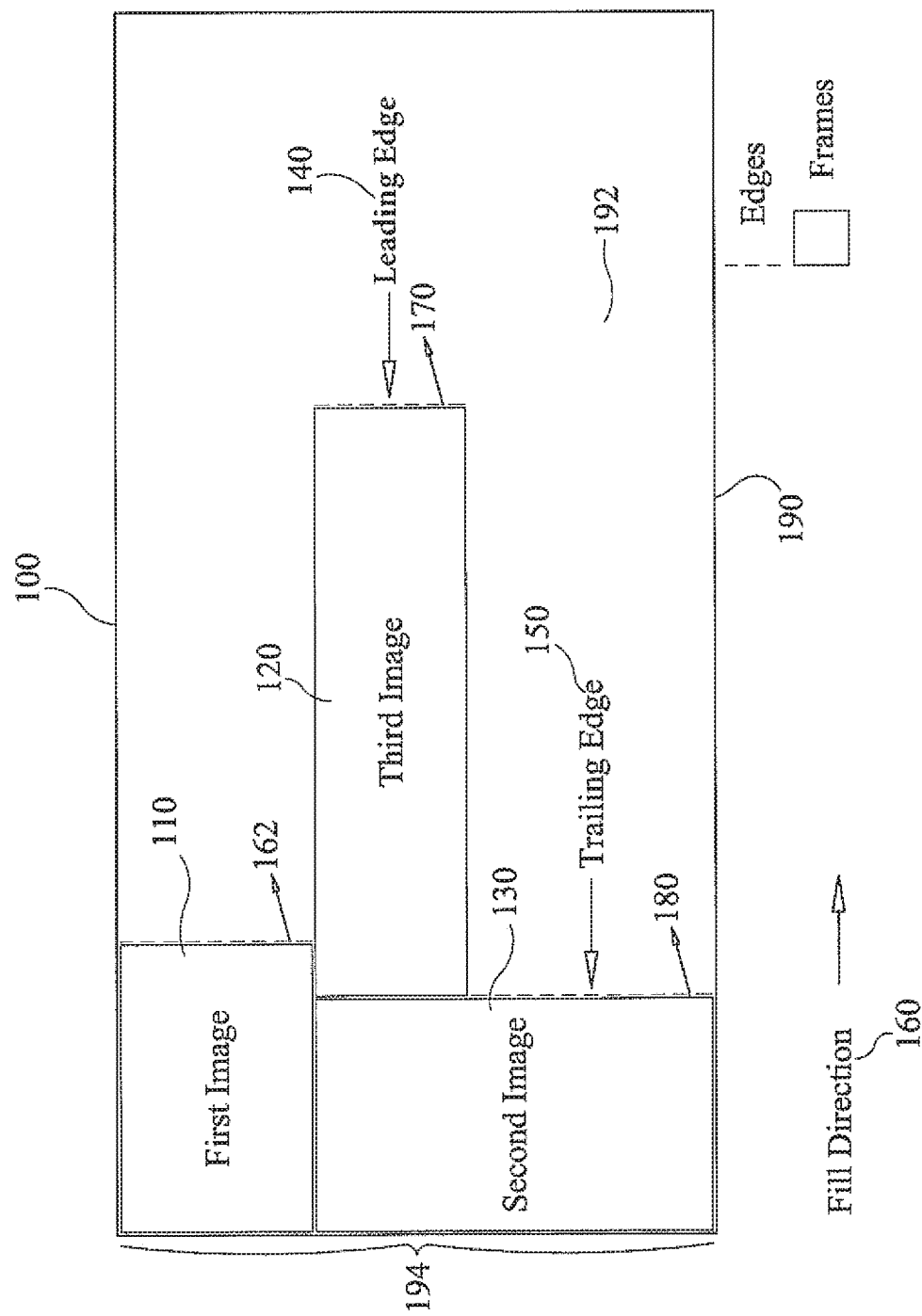
FIG. 1 illustrates some of the basic components the disclosed method employes to create a Mosaic of media files.

In this application the terms "media files" and "image files" are used interchangeably to include photographs, three dimensional images, and the like. FIG. 1 depicts some of the basic components the disclosed method employs in order to create a Mosaic of media files. A user may conduct a search for certain media files via a computing device, not shown in FIG. 1. A computing device would be well understood by one of ordinary skill in the art to be any device which performs computing functions. By way of example, an iPad® is a computing device. In response to a user query the method may receive a set of searched media files (media files) and metadata associated with the media files. The media files are to be placed on an empty space on a user interface 100 of the computing device. FIG. 1 is an example of the user interface.

Empty space may indicate a space that is to be filled with the media files. A Mosaic is constructed as the images are placed in the empty space situated on the user interface 100. An edge set may be a set of vertical line segments consisting of the leading edges of a set of previously placed images, wherein the summation of the height of each leading edge of the set of previously placed images equals the height of the empty space to be filled. Prior to placing a first image on the user interface 100, an edge set may comprise the trailing edge of the empty space. Partially filled empty space 192 may represent a situation where some images have already been placed on the empty space leaving some space to accommodate images that will be placed in the future. Container 190 on the interface 100 as depicted in FIG. 1 comprises three images: a first image 110, a second image 130, and a third image 120 that have been previously placed on the interface 100. Further, the container 190 also includes a partially filled empty space 192 on the interface 100.

The fill direction 160 on interface 100 indicates the direction in which the media files are to be placed on the empty space or partially filled empty space. For a given edge set, the fill direction may cause the mosaic construction to start from the left edge and proceed by placing the media files in a right-bound direction. Similarly, for a given edge set, the fill direction may start from an intermediate position and proceed in both left-bound and right-bound direction alternately. In the preferred embodiment of the disclosed invention, when the fill direction arrow is pointing to the right direction, as depicted by the fill direction 160 in FIG. 1, the media files are placed from left to right direction on the interface 100. In this embodiment, the media files are secondarily filled from top to bottom. The first image 110 may be placed at the left top corner of the interface 100 for the right-ward fill direction 160. The second image 130 may be placed beneath the first image, if enough space is available beneath the first image 110 to accommodate the second image 130, otherwise the second image 130 may be placed to the right side of the first image 110.

Also illustrated in FIG. 1 is the edge set comprising three edges: a first edge 162 which is the right edge of the first image 110, a trailing edge 170 which is the right edge of the third image 120 and a third edge 180 which is the right edge of the second image 130. The edge set may be a set of vertical line segments comprising the leading edges of a set of previously placed images, wherein the summation of the height of each leading edge of the set of previously placed images equals the height of the empty space to be filled. For a given edge set and a fill direction, a leading edge may be the edge in the edge set whose horizontal position is the greatest in the fill direction. Likewise, for a given edge set and a fill direction, a trailing edge may be the edge in the edge set whose horizontal position is the least in the fill direction. Trailing edge 150 is the edge located farthest back away from the fill direction 160. An adjacent edge may be an edge that is located vertically adjacent to the trailing edge. Accordingly, in FIG. 1, the leading edge 140 is the adjacent edge to the trailing edge 150.

Figure 6:
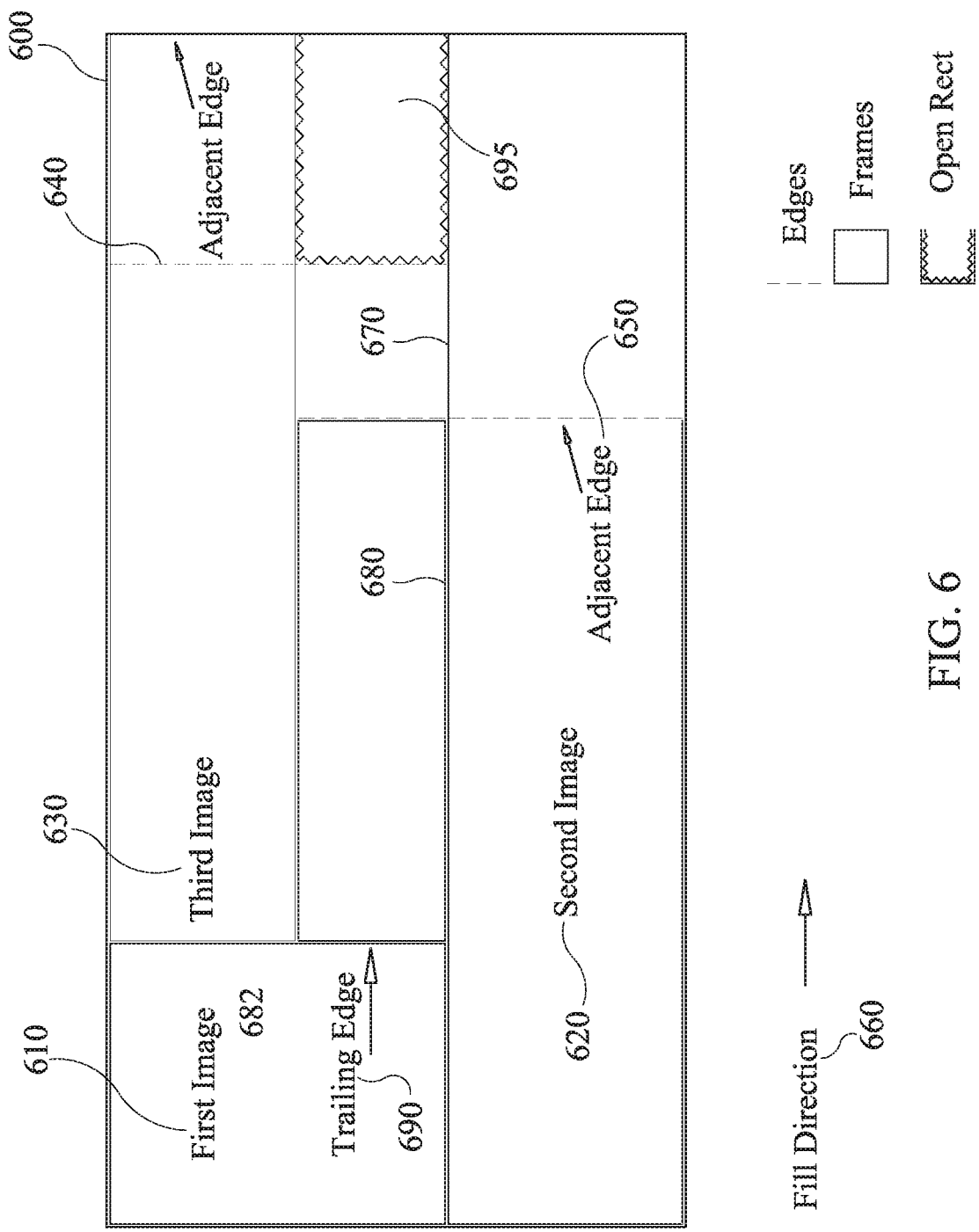
FIG. 6 depicts the concept of closed and open rectangles in a preferred embodiment of the disclosed invention.

FIG. 6 depicts the concept of closed and open rectangles in a preferred embodiment of the disclosed invention. In FIG. 6 an edge set is illustrated comprising edges 640, 650 and 690. A trailing edge 690 is located farthest back away from the fill direction 660 and the adjacent edges 640 and 650 are located vertically adjacent to the trailing edge 690. It will be appreciated that the only vertical adjacency is considered while determining the adjacent edges. In other words, an adjacent edge may be an edge that is located vertically adjacent to the trailing edge, regardless of the horizontal distance between the edges. The concepts of the leading edge and the trailing edge are pertinent while constructing open rectangle and closed rectangles. As shown in FIG. 6, for any given trailing edge such as trailing edge 690, the method may project the trailing edge to the position of an adjacent edge to form a closed rectangle.

For example, as shown in FIG. 6, the trailing edge 690 may be projected forward horizontally to the horizontal position of the adjacent edge 650 to form a first closed rectangle 680. Similarly, the trailing edge 690 may be projected forward horizontally to the horizontal position of the adjacent edge 640 to form a second closed rectangle 670. An open rectangle 695 may be created by projecting the trailing edge 690 forward horizontally to infinity. In other words, an open rectangle is created by projecting the trailing edge forward in the fill direction with no upper bound on the width of the open rectangle.

Notably, as shown in FIG. 6, since the trailing edge 690 has two adjacent edges 640 and 650, two closed rectangles 670 and 680 as well as one open rectangle 695, may be formed. Conversely, if a trailing edge has only one adjacent edge, then only one closed rectangle and one open rectangle may be formed. Likewise, if a trailing edge does not have any adjacent edge, then no closed rectangle and one open rectangle may be formed. Each closed rectangle may have a fixed height, which is the height of the trailing edge and a fixed width, and wherein each open rectangle may have a fixed height, which is the height of the trailing edge. However, the open rectangle may not have a fixed width, since open rectangle is created by projecting the trailing edge forward horizontally to infinity. Accordingly, an open rectangle is constructed by extending the trailing edge in the fill direction such that the open rectangle has an unbounded width.

Figure 2:
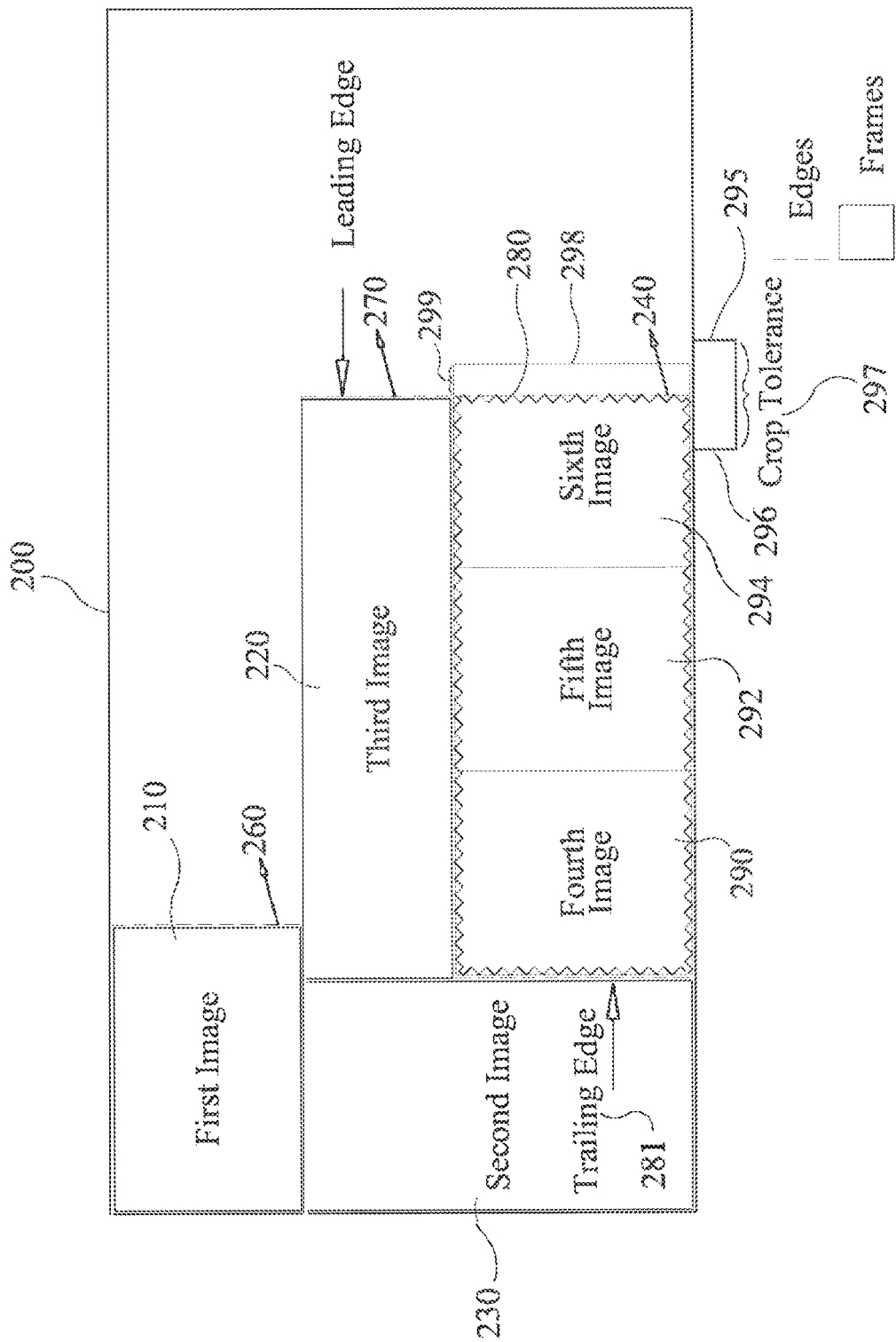
FIG. 2 shows some of the steps involved in selecting images to fill a closed rectangle.

FIG. 2 illustrates steps involved in selecting images to fill a closed rectangle. An interface 200 as depicted in FIG. 2 comprises three images: a first image 210, a second image 230, and a third image 220 that have been previously placed on the interface 200. The trailing edge 281 in FIG. 2 may be projected forward horizontally to the horizontal position of the adjacent edge 270 to form a closed rectangle 280. Upon receiving a set of searched media files which are to be placed on an empty space on the user interface, the method may store the received media files in an image buffer, not shown in FIG. 1-11. In order to fill the closed rectangle 280, the method may iterate through the images stored in the image buffer by considering each image one at a time, examining the aspect ratio of a given image to determine if the image will be of appropriate size when shrunk to fit into the closed rectangle 280. The method may configure a set of dimension rules regarding minimum and maximum limitations on the height and the width of the images. Accordingly, the method may (1) select an image (2) see if the image can be sized to fit a given closed rectangle without violating any rule in the set of dimension rules (3) any images that do not satisfy the set of dimension rules are discarded, added to a rejected candidate list.

All images in the rejected candidate list are returned to the image buffer after a given closed rectangle is filled or until the given closed rectangle is discarded. A rejection threshold may be a maximum number of images that can be rejected prior to filling a given closed rectangle. This loop terminates if any of the following conditions are met: (1) the number of rejected images are equal to or greater than the rejection threshold; (2) if the image placement results in causing overflow past the end of the closed rectangle; and (3) if the sum of the width of all the images that are attempted to be placed inside the closed rectangle is within some tolerance of the width of the closed rectangle.

As for the first condition, when the number of rejected images are equal to or greater than the rejection threshold, this condition may occur if all the images being considered are vertical panoramas which are very narrow as compared to their height. In this case, none of the images can fit in the closed rectangle 280 without violating dimension rules since the vertical panoramic images would not have large enough width to fit the closed rectangle 280. Since, the vertical panoramic images do not have the mandated minimum width, the vertical panoramic images will be rejected and the loop will end.

FIG. 2 depicts a simultaneous occurrence of the second and third terminating conditions. A crop tolerance is a value for determining the acceptable deformation of an image or set of images aspect ratios. FIG. 2 illustrates that a crop tolerance attribute 297 may go in either directions. Thus, the disclosed method comprises resizing a given set of media files if the given set of media files fills a given closed rectangle within a crop tolerance. The closed rectangle 280 in FIG. 2 is depicted as having two limits: a lower bound crop tolerance 296 and an upper bound crop tolerance 295. Although the combined width 298 of a fourth image 290, a fifth image 292, and a sixth image 294 exceeds the right edge of the closed rectangle 280, the excess width 299 is within the upper bound crop tolerance 295. Thus, the fourth image 290, the fifth image 292, and the sixth image 294 may each be resized such that the combined width 298 of these images fall within the boundaries of the closed rectangle 280. Resizing in this context indicates shrinking the fourth image 290, the fifth image 292, and the sixth image 294 such that their combined width 298 falls within the right edge of the closed rectangle 280. Alternatively, even if the combined width 298 of a fourth image 290, a fifth image 292, and a sixth image 294 is narrower of the right edge of the closed rectangle 280, as long the combined width is within the lower bound crop tolerance 296, the fourth image 290, the fifth image 292, and the sixth image 294 may each be resized so that the combined width 298 of these images falls within the boundaries of the closed rectangle 280. Resizing in this context indicates enlarging the fourth image 290, the fifth image 292, and the sixth image 294 such that their combined width 298 falls within the right edge of the closed rectangle 280. Accordingly, if the set of media files is longer than a horizontal closed rectangle but within the crop tolerance, then each media file in the set of media files is cropped horizontally to fill the horizontal closed rectangle. Likewise, if the set of media files is not long enough to fill a horizontal closed rectangle but within the crop tolerance, then each media file in the set of media files is cropped vertically and scaled up to fill the horizontal closed rectangle.

Figure 3:
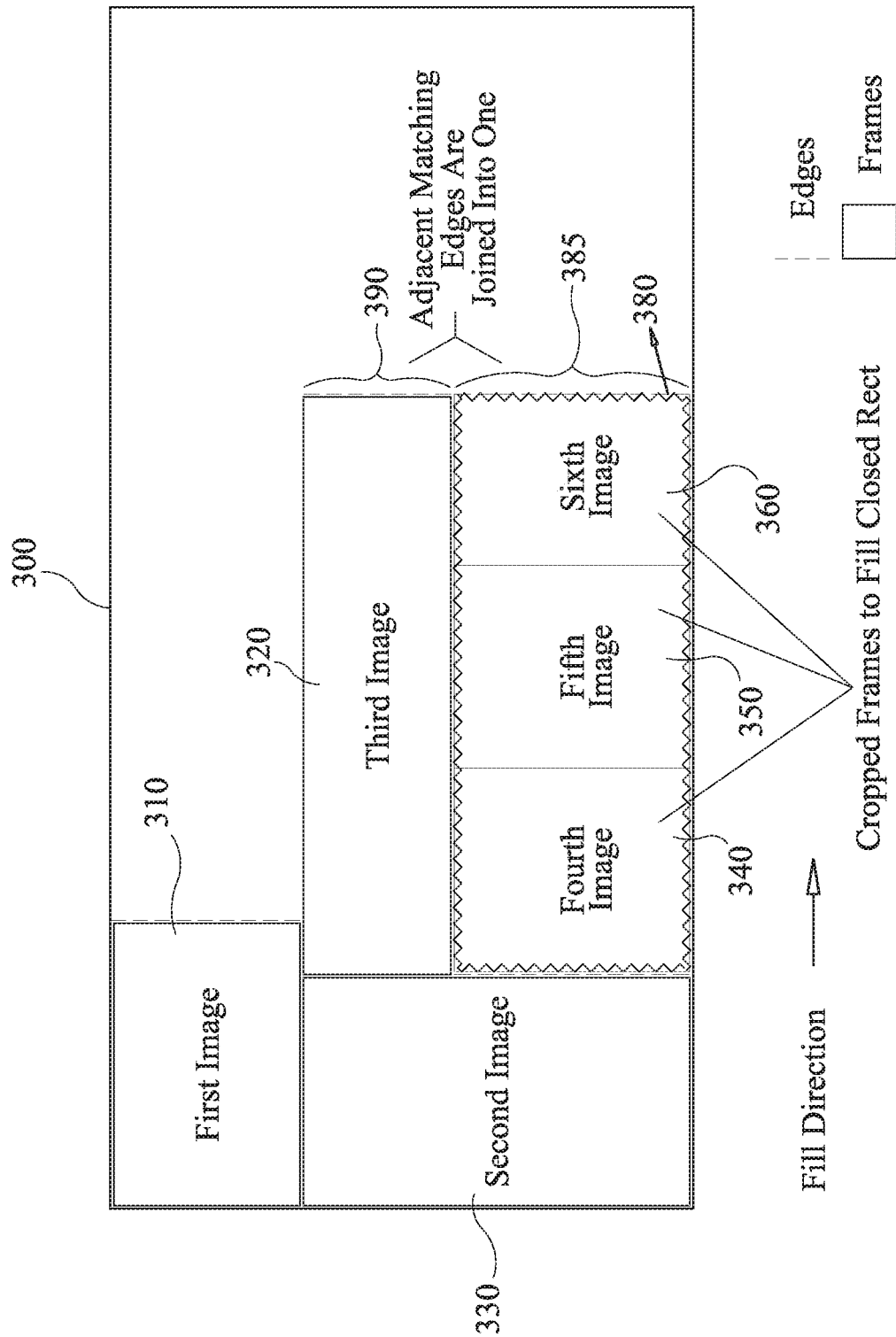
FIG. 3 depicts the successful placement of the resized images in a closed rectangle.

FIG. 3 depicts the successful placement of the resized images in a closed rectangle. In particular, FIG. 3 illustrates a situation in which the three images in the FIG. 2 are resized and placed in the closed rectangle 280. As described above, the crop tolerance is a value for determining the acceptable deformation of an image or set of images aspect ratios. In one embodiment, the crop tolerance is a constant percentage value. In this embodiment, the crop tolerance may be defined as a percentage of the width of the closed rectangle. For example, if the crop percentage is 10% of the width of the closed rectangle, and the sum of the three images is not more than 10% larger than the width of the closed rectangle, then the three images can be resized. As seen in FIG. 3, the three images in FIG. 2 (the fourth image 290, the fifth image 292, and the sixth image 294) are each resized so that the combined width 298 of these images falls within the boundaries of the closed rectangle 280. Specifically, FIG. 3 illustrates a fourth image 340, which is slightly narrower than the fourth image 290 in FIG. 2. Similarly, a fifth image 350 in FIG. 3 is slightly narrower than the fourth image 292 in FIG. 2 and a sixth image 360 in FIG. 3 is slightly narrower than the sixth image 294 in FIG. 2. Thus, the shapes of the fourth image 290, the fifth image 292, and the sixth image 294 are changed only slightly in order to preserve the overall feeling of the images such that user can still appreciate the way the contents are framed.

In other words, the fourth image 290, the fifth image 292, and the sixth image 294 in FIG. 2 are being replaced by the fourth image 340, the fifth image 350, and the sixth image 360 in FIG. 3 so that the combined width of the fourth image 340, the fifth image 350, and the sixth image 360 fills the closed rectangle 380 precisely. One of the goals of this image placement is to join the two edges: the edge 390 of the third image 320 and the edge 385 of the closed rectangle 380, so that the joined edge may be treated as a single edge in the subsequent iterations. This feature allows the method to construct a Mosaic of images where image sizes and image shapes can seamlessly change from layout to layout in a pleasing manner.

Figure 4:
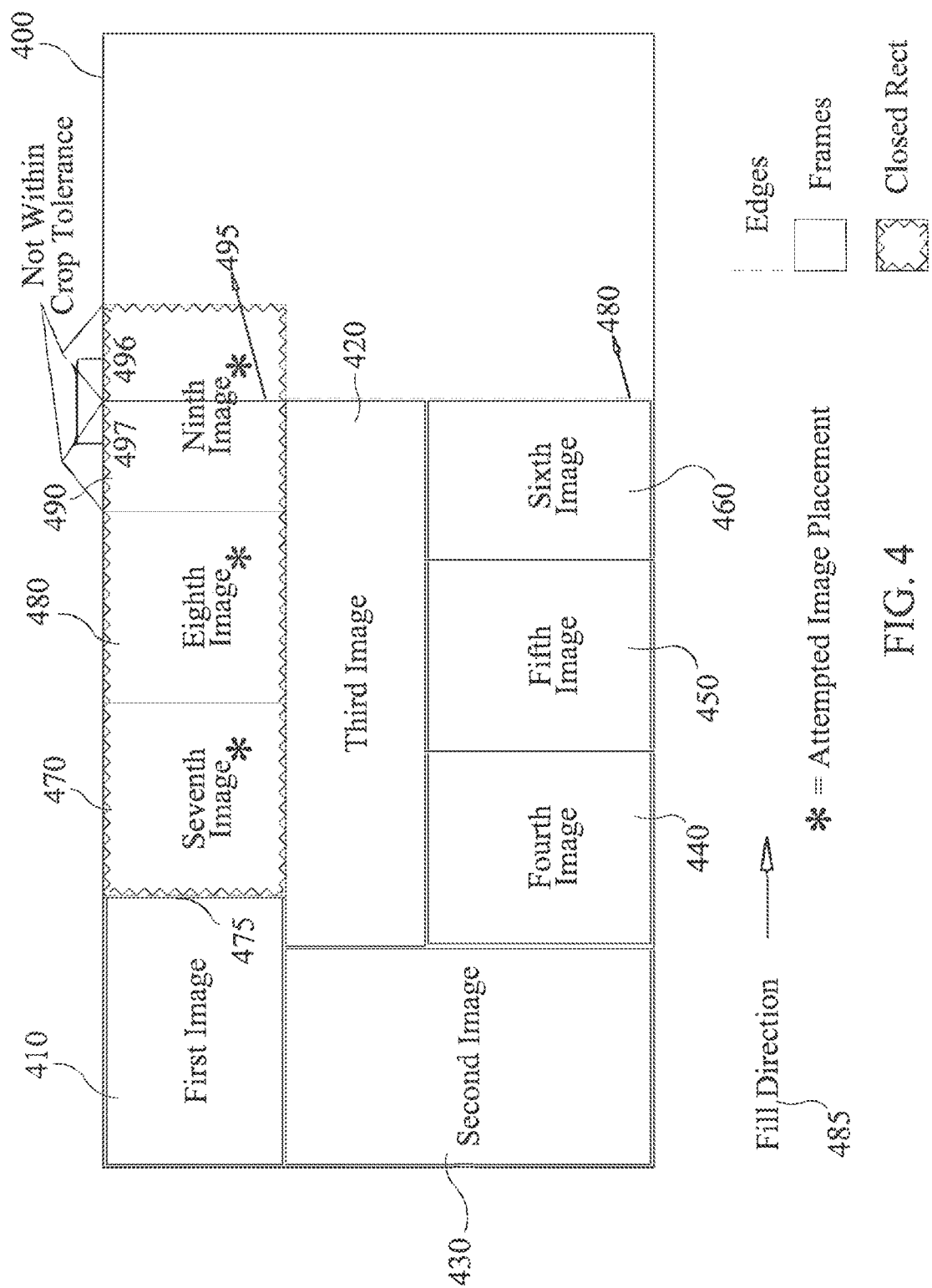
FIG. 4 shows depicts the unsuccessful placement of the images in a closed rectangle.

FIG. 4 depicts the unsuccessful placement of the resized images in a closed rectangle. The disclosed method comprises iteratively attempting to fill up to one closed rectangle from the set of closed rectangles by performing the following operations until one of the following conditions occur: a predefined limit of media files are processed, the selected set of media files extend past the boundary of the closed rectangle, or the selected set of media files fill the closed rectangle within crop tolerance: (1) iteratively determining if a candidate media file fits in a given closed rectangle until a candidate media file is found that fits the given closed rectangle, or if after attempting to fit a predefined number of candidate media files in the given closed rectangle, it is observed that none of the attempted candidate media files fit the given rectangle; (2) adding the candidate media file to the set of selected media files to fill the given closed rectangle if the candidate media file fits in the given closed rectangle; (3) placing the candidate media file in a rejected candidate list if the candidate media file does not fit in the given closed rectangle; and (4) resizing and placing the candidate media file in the closed rectangle if the candidate media file fills the closed rectangle within the crop tolerance, otherwise aborting the filling of the given closed rectangle.

In FIG. 4, another closed rectangle 495 is created by projecting a trailing edge 475 forward in the fill direction 485 to the horizontal position of an adjacent edge 480, which is the joined edge 390 that was created by combining the edge 390 of the third image 320 and the edge 385 of the closed rectangle 380 in FIG. 3. In other words, a set of closed rectangles is constructed by extending the trailing edge forward to the position of each adjacent edge in the edge set. Three images (a seventh image 470, an eighth image 480, and a ninth image 490) are selected from the image buffer. These three images, when placed in the closed rectangle 495 do not violate the minimum and maximum sizes for the images i.e. the dimension rules. It is observed that the boundary of the three images extends past the edge of the closed rectangle 495. Suppose, as in FIG. 3, the crop tolerance of the closed rectangle 495 was 10% of the width of the closed rectangle 495, with an upper crop tolerance 496 and a lower crop tolerance 497, it is observed that the boundary of the three images extends past the edge of the closed rectangle 495, and the boundary of the three images does not fall within the an upper crop tolerance 496 of the closed rectangle 495. At this point, the method may abandon the attempt to fill the closed rectangle 495 and proceed to fill an open rectangle, this process is depicted in FIG. 5.

The criteria of determining when to abandon an attempt to fill a closed rectangle is arbitrary. In the preferred embodiment of the disclosed invention as described in FIG. 4, an attempt to fill a closed rectangle is abandoned if the combined width of the images extends past the edge of the closed rectangle, and if the combined width of the images does not fall within an upper crop tolerance of the closed rectangle. Likewise, the attempt to fill a closed rectangle is abandoned if the combined width of the images falls within the edge of the closed rectangle, and if the combined width of the images does not fall within the lower crop tolerance of the closed rectangle.

Alternatively, the method may only discard the ninth image 490 and consider other images that can be combined with the seventh image 470 and the eighth image 480 to precisely fill the closed rectangle 495. This illustrates the manner in which the disclosed method attempts to fill a given closed rectangle precisely, and abandons the attempt if the given images fail to fill the given closed rectangle precisely.

Figure 5:
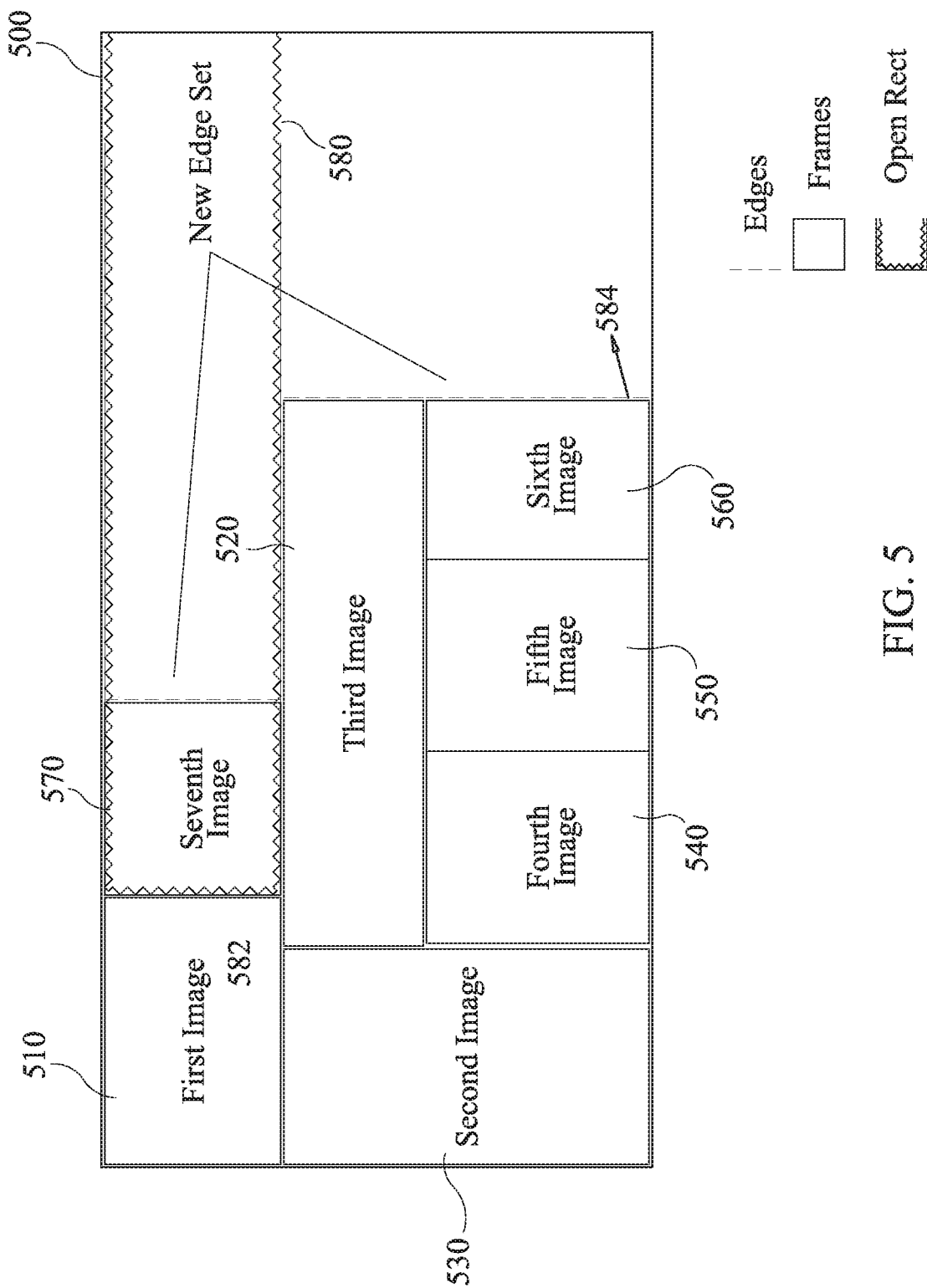
FIG. 5 depicts initiating open rectangle image placement after abandoning the closed rectangle image placement.

FIG. 5 depicts the process of initiating open rectangle image placement after abandoning the closed rectangle image placement. Accordingly, the disclosed method comprises attempting to fill an open rectangle if the given set of media files exceeds the size of the given closed rectangle beyond the crop tolerance. An interface 500 has a first image 510, a second image 530, a third image 520, a fourth image 540, a fifth image 550, and a sixth image 560 that are already placed on the layout. As described above, an attempt to fill a closed rectangle is abandoned if the combined width of the images that were aspired to precisely fill the closed rectangle overflowed and ended up at a horizontal position that is located beyond the upper crop tolerance of the closed rectangle. An attempt to fill an open rectangle 580 is initiated as illustrated in FIG. 5. As discussed above, an open rectangle may be created by projecting a trailing edge 582 forward horizontally to infinity. The method may iterate through the available images from the image buffer until the method identifies an image that has at least one size that fits into the open rectangle 580.

The at least one size of the identified image is determined according to a set of predetermined size limitations not described here. The size limitations ensure that the at least one size of the identified image is not smaller than a minimum size or larger than a maximum size. Accordingly, a seventh image 570 is identified such that the selected size of the seventh image 570 optimally fills at least part of the open rectangle 580. The method attempts to optimally fill an open rectangle with an image, but if the method fails to do so, then the method may take a first available image and resize it so that the image fits into the open rectangle disregarding the aspect ratio constraint of the given image.

Figure 7:
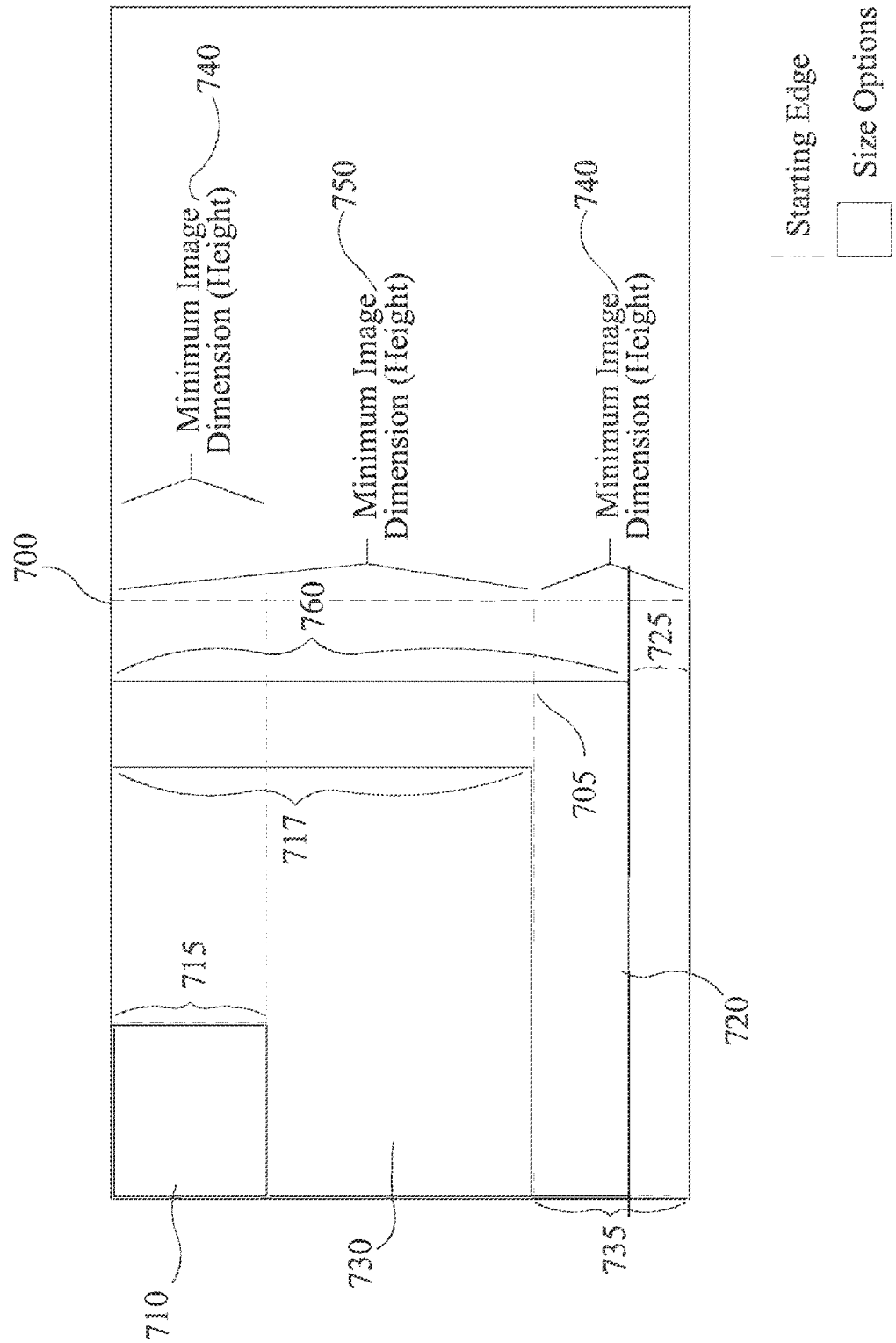
FIG. 7 illustrates a variety of image representation options that may be selected while filling an open rectangle.

FIG. 7 illustrates a variety of image representation options that may be selected while filling an open rectangle 705 on an interface 700. It will be appreciated that the method has an option of selecting a specific image representation from several image representations to fill a given open rectangle. Additionally, the method has an option of not filling the given open rectangle completely, as described in FIG. 5, where the seventh image 570 optimally fills only part of the open rectangle 580. The specific image representation selection process is contingent upon a preconfigured set of constraints that define how images are to be presented in the given open rectangle.

The method may select a smallest possible image presentation 710 of a given image after considering the aspect ratio of the given image. The selected image representation 710 is selected such that the smallest image dimension of the selected image presentation 710 equals a predefined minimum image dimension 740. In this case, the minimum image dimension is defined as the height of the selected image, so the height 715 of the selected image representation 710 is equal to the predefined minimum image dimension 740.

Alternatively, the method may select an image presentation 730 of the given image such that the larger image dimension of the image presentation 730 equals a predefined maximum image dimension 750. In this case, the maximum image dimension of the given image is the height, so the height 717 of the selected image presentation 730 of the given image is equal to the predefined maximum image dimension 750.

Notably, if a largest possible image presentation 720 is selected, then the height 750 of the image presentation 720 of the given image is larger than the maximum image dimension 760. If the image presentation 720 of the given image is selected, then the remaining space 725 located beneath the image presentation 720 is less than the minimum image dimension 740. In other words, if the image presentation 720 of the given image is selected to fill the open rectangle 705, then no room will be left to place any other images beneath the image presentation 720. Instead of selecting the image presentation 720, the method may scale down the given image to the size indicated by image presentation 730 so that the remaining space 735 is of sufficient size to fit yet another image, where the height of the yet another image equals to the minimum image dimension 740.

Accordingly, the process may select an image representation of a specific size from a variety of image representation size options. The image representation size options are limited by a set of predefined arbitrary constraints such as minimum and maximum sizes. The minimum and maximum sizes of a given image may alternatively depend on the image aspect ratio and the image orientation.

Figure 8:
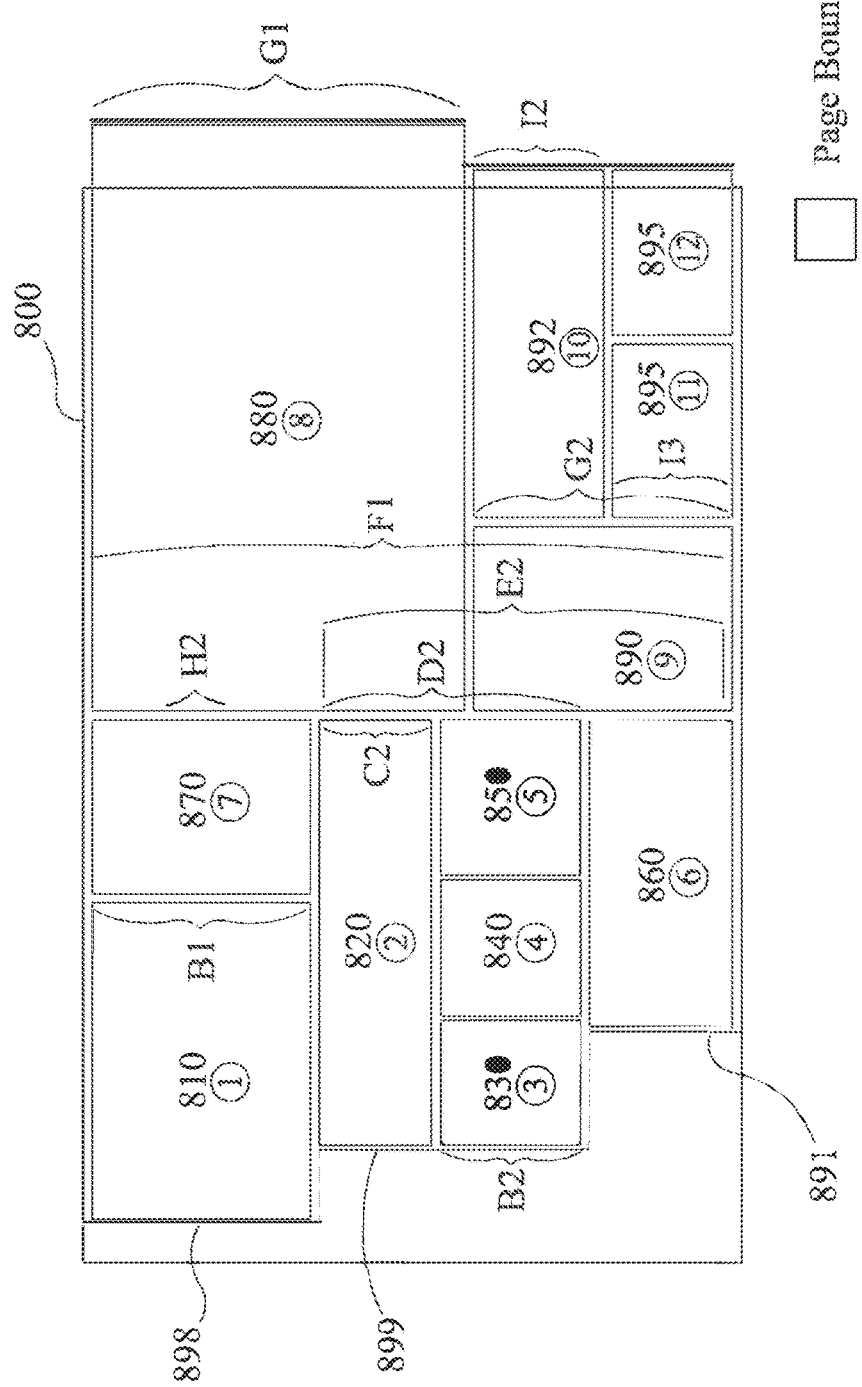
FIG. 8 depicts the sequential image placement process according to a preferred embodiment of the disclosed invention.

FIG. 8 illustrates the sequential image placement process according to a preferred embodiment of the disclosed invention. Interface 800 depicts edges 898, 899 and 891 that are in the initial edge set which are defined by previous page layout. The trailing edge 898 is projected forward horizontally to the horizontal position of an adjacent edge 899 to form a first closed rectangle. Since no images could be filled in the first closed rectangle, an attempt is made to fill a first open rectangle created by projecting the trailing edge 898 forward horizontally to infinity. An image 1 indicated by numeral 810 is filled in the first open rectangle.

After image 1 is placed in the first open rectangle, the edge set is updated to include edges 899, 891 and edge B1. The edge 899 is the new trailing edge, and a second closed rectangle is created by projecting the trailing edge 899 forward horizontally to the horizontal position of the adjacent edge 891. Since the second closed rectangle cannot be filled, a third closed rectangle is created by projecting the trailing edge 899 forward horizontally to the horizontal position of the adjacent edge B1. The third closed rectangle also cannot be filled, thus, an attempt is made to fill a second open rectangle created by projecting the trailing edge 899 forward horizontally to infinity. Then, an image 2 indicated by the reference numeral 820 is placed in the second open rectangle. Notably, the image 2 is selected, sized and placed leaving enough space below image 2 so that additional images can be placed beneath image 2.

After image 2 is placed in the second open rectangle, the edge set is updated to include edges B1, C2, B2, and edge 891. The edge 82 is the new trailing edge, a fourth closed rectangle is created by projecting the trailing edge 82 forward horizontally to the horizontal position of the adjacent edge 891. Since the fourth closed rectangle cannot be filled, a fifth closed rectangle is created by projecting the trailing edge 82 forward horizontally to the horizontal position of the adjacent edge C2. Then an image 3, an image 4 and an image 5 indicated by the reference numerals 830, 840 and 850 respectively are placed in the fifth closed rectangle.

After images 3, 4, and 5 are placed in the fifth closed rectangle, the edge set is updated to include edges B1, B2, and edge 891. The edge 891 is the new trailing edge, and a sixth closed rectangle is created by projecting the trailing edge 891 forward horizontally to the horizontal position of the adjacent edge B2. Then an image 6 indicated by the reference numeral 860 is placed in the sixth closed rectangle. Notably, the edges of images 2, 5 and 6 are all joined to create a new joined edge E2.

After image 6 is placed in the sixth closed rectangle, the edge set is updated to include edges 81 and E2. The edge B1 is the new trailing edge, and a seventh closed rectangle is created by projecting the trailing edge 81 forward horizontally to the horizontal position of the adjacent edge E2. Then an image 7 indicated by the reference numeral 870 is placed in the seventh closed rectangle. At this point, the edges 81 and E2 are joined to create an edge F1.

After image 7 is placed in the seventh closed rectangle, the edge set includes a single edge F1. Since there are no adjacent edges to the edge F1, no closed rectangles can be formed. Thus, an attempt is made to fill a third open rectangle which is created by projecting the trailing edge F1 forward horizontally to infinity. Then, an image 8 indicated by the reference numeral 880 is placed in the third open rectangle.

After image 8 is placed in the third open rectangle, the edge set includes an edge G1 and G2. The edge G2 is the new trailing edge, and an eighth closed rectangle is created by projecting the trailing edge G2 forward horizontally to the horizontal position of the adjacent edge G1. Since the eighth closed rectangle cannot be filled, an attempt is made to fill a fourth open rectangle which is created by projecting the trailing edge G2 forward horizontally to infinity. Then an image 9 indicated by the reference numeral 890 is placed in the fourth open rectangle.

After image 9 is placed in the fourth open rectangle, the edge set includes an edge G1 and H2. The edge H2 is the new trailing edge, and a ninth closed rectangle is created by projecting the trailing edge H2 forward horizontally to the horizontal position of the adjacent edge G1. Since the eighth closed rectangle cannot be filled, an attempt is made to fill a fifth open rectangle which is created by projecting the trailing edge H2 forward horizontally to infinity. Then an image 10 indicated by the reference numeral 892 is placed in the fifth open rectangle.

After image 10 is placed in the fifth open rectangle, the edge set includes an edge G1, 12 and 13. The edge 13 is the new trailing edge, and a tenth closed rectangle is created by projecting the trailing edge 13 forward horizontally to the horizontal position of the adjacent edge 12. Then images 11 and 12 indicated by the reference numerals 894 and 895 respectively are placed in the tenth closed rectangle.

Now that every edge in the edge set has extended past the boundary of the current page, so this concludes a single page of layout comprising images 1 through 12. For the next page of layout generation we start with edges G1 and 12 as an initial edge set.

Figure 9:
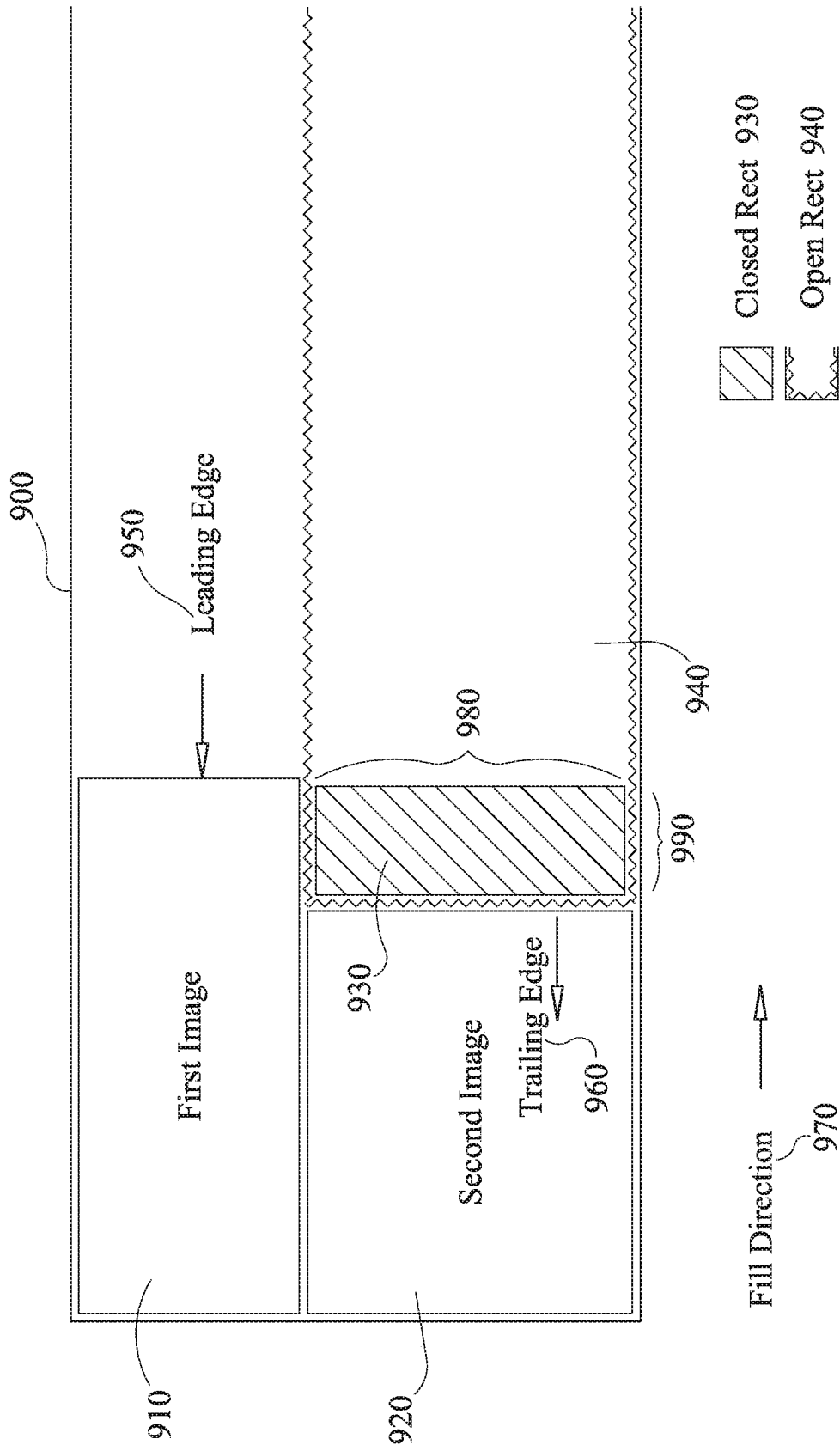
FIG. 9 illustrates an attempt to vertically fill a closed rectangle according to a preferred embodiment of the disclosed invention.

FIG. 9 illustrates an attempt to vertically fill a closed rectangle according to a preferred embodiment of the disclosed invention. Interface 900 depicts a first image 910, and a second image 920. A closed rectangle 930 is formed when the trailing edge 960 is projected forward horizontally in the fill direction 970 to the horizontal position of a leading edge 950. Likewise, an open rectangle 940 is formed when the trailing edge 960 is projected forward horizontally in the fill direction 970 to infinity. A decision has to be made prior to placing a first image in the closed rectangle 930 as to whether images are to be placed vertically or horizontally. Before attempting to place a first image in the closed rectangle 930, the first image may be scaled to fit inside the closed rectangle 930.

If the height of the selected image which has been scaled down to fit into the closed rectangle 930 matches the height 980 of the closed rectangle 930, and that scaled down image is not smaller than a predefined threshold, then the selected image is placed horizontally in the closed rectangle 930. Then on, the method proceeds to fill the closed rectangle 930 horizontally.

Conversely, if the width of the selected image which has been scaled down to fit into the closed rectangle 930 matches the width 990 of the closed rectangle 930, and that scaled down image is not smaller or larger than the predefined threshold, then the selected image is placed vertically in the closed rectangle 930, such that the width of the selected image matches with the width 990 of the closed rectangle 930. This placement may typically leave space beneath the vertically placed image for subsequent image placement. Then onward, the method proceeds to fill the closed rectangle vertically. This process is described in FIG. 10.

Figure 10:
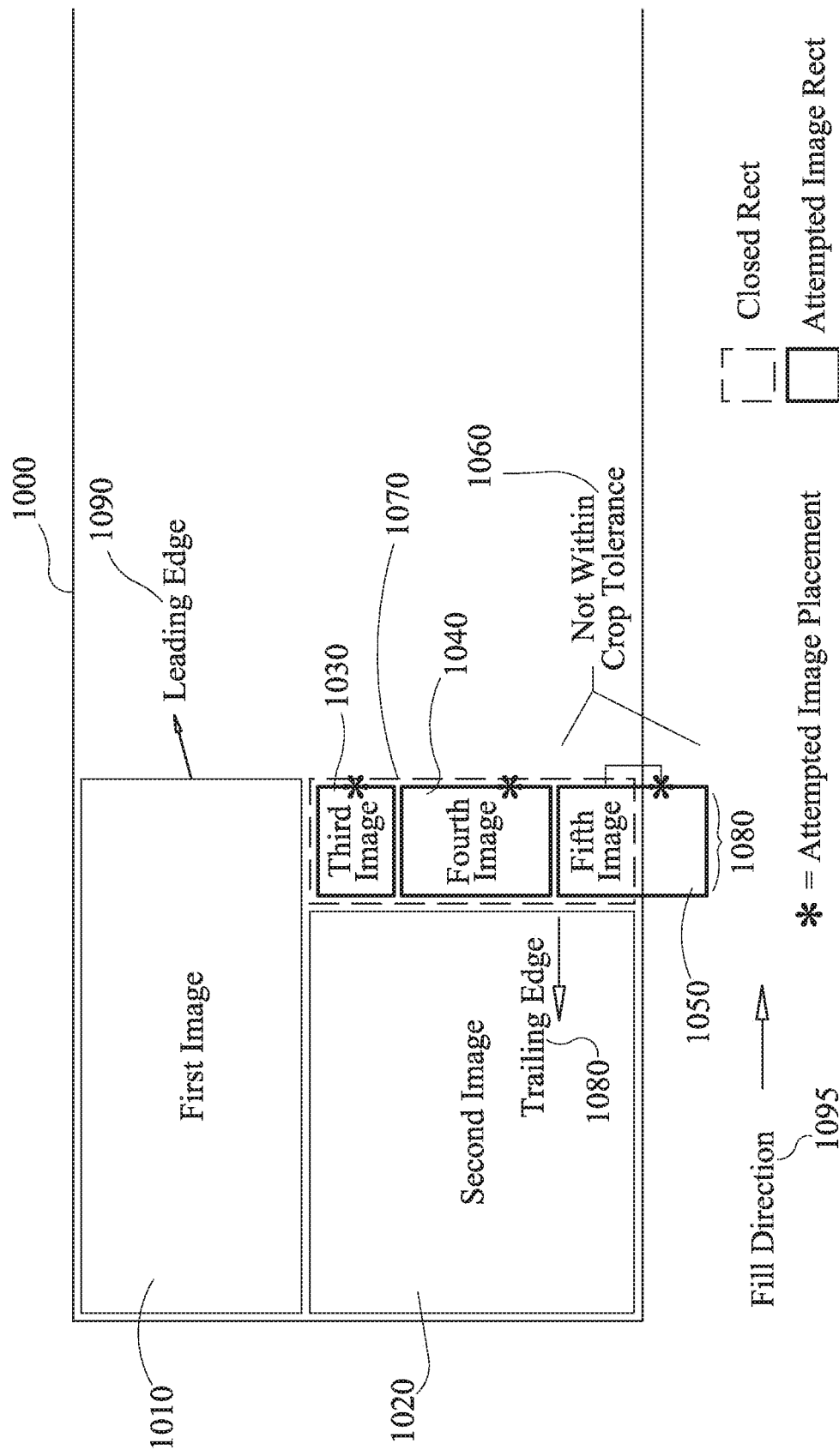
FIG. 10 depicts the manner of processing an unsuccessful attempt to vertically fill a closed rectangle according to a preferred embodiment of the disclosed invention.

FIG. 10 depicts an unsuccessful attempt to vertically fill a closed rectangle according to a preferred embodiment of the disclosed invention. Interface 1000 depicts a first image 1010, and a second image 1020. A rectangle 1070 is formed when the trailing edge 1080 is projected forward horizontally in the fill direction 1095 to the horizontal position of a leading edge 1090. An attempt is being made in FIG. 10 to place a third image 1030, a fourth image 1040 and a fifth image 1050 in the rectangle 1070. A closed rectangle which does not contain any images is referred to as an empty closed rectangle. As such, the empty closed rectangles, by themselves do not have an orientation. The manner in which the images are placed in the closed rectangles determines the orientation of the closed rectangles. The width of a third image 1030, when scaled down to fit inside a rectangle 1070 matches the width of the rectangle 1070. Thus, an attempt is made to fill the rectangle 1070 vertically.

The third image 1030 and a fourth image 1040 each have the width that matches width 1080 of the rectangle 1070, and scaled down third image 1030 and the scaled down fourth image 1040 are not smaller or larger than the predefined threshold, thus the selected images are placed vertically in the rectangle 1070. However, in regards to the fifth image 1050, it is observed that although the width of the fifth image 1050 matches with the width 1080 of the rectangle 1070, the scaled down fifth image is not within the crop tolerance 1060. Thus, after aborting the attempt to fill the rectangle 1070 vertically, the method proceeds to fill the open rectangle 940 depicted in FIG. 9. This process is described in FIG. 11.

Figure 11:
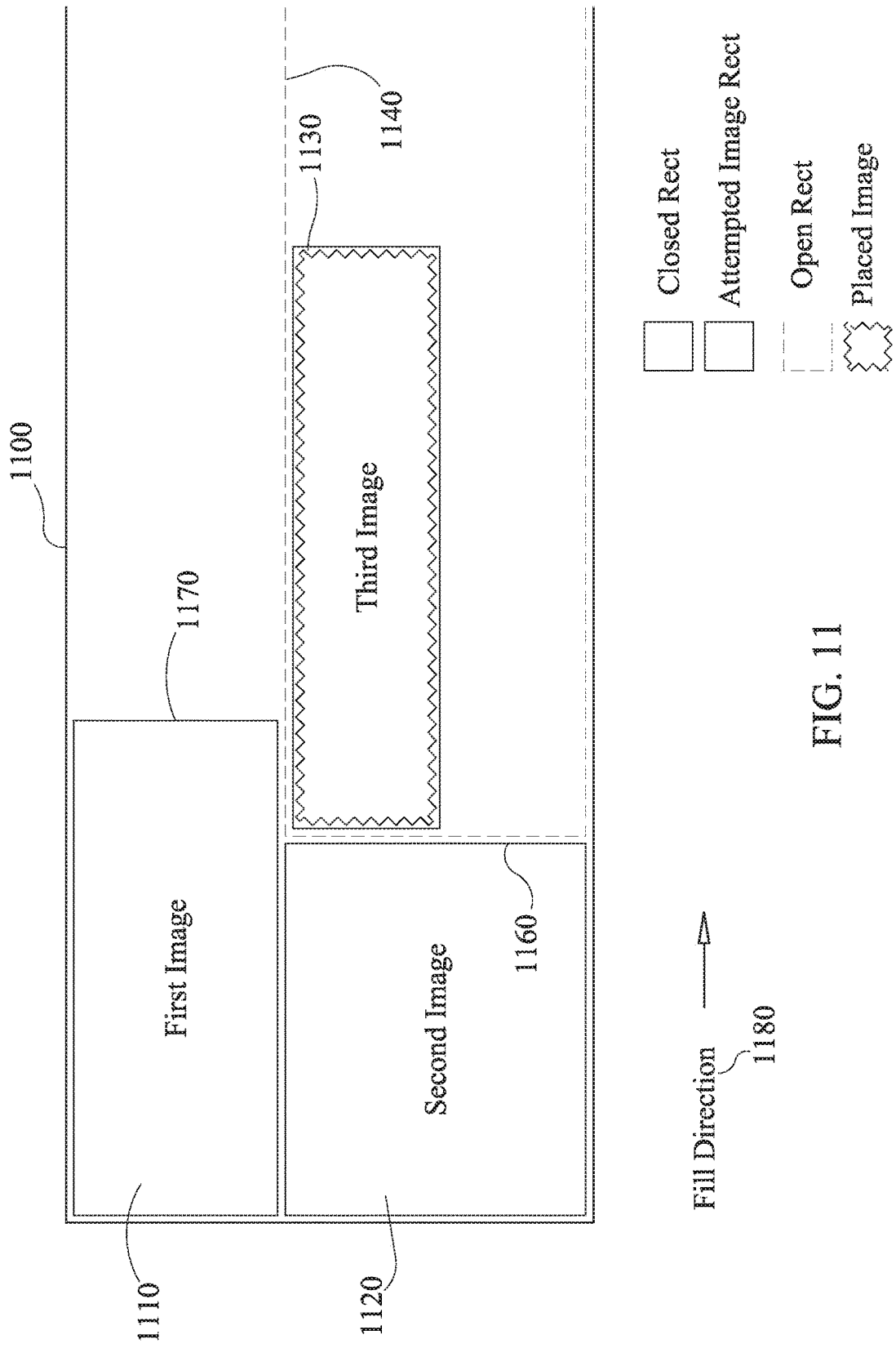
FIG. 11 illustrates an attempt to fill an open rectangle after abandoning an attempt to vertically fill a closed rectangle.

The disclosed method comprises placing one media file in the open rectangle, such that the one media file either fills the open rectangle vertically or leaves enough vertical space beneath the one media file to accommodate an additional media file. FIG. 11 depicts an attempt to fill an open rectangle after abandoning an attempt to vertically fill a closed rectangle. Interface 1100 depicts a first image 1110, and a second image 1120. An open rectangle 1140 is formed when the trailing edge 1120 is projected forward horizontally in the fill direction 1095 to the infinity. As described above, after encountering an attempt to fill a rectangle 1070 in FIG. 10, the method proceeds to fill the open rectangle 1140. It is observed that the third image 1130, which is a panoramic image, is too wide to scale to fill open rectangle 1140 vertically but the third image 1130 can be placed horizontally leaving space below for subsequent image placement. Accordingly, the third image 1130 is placed horizontally in the open rectangle 1140.

What is claimed is:

1. A method for displaying a dynamic mosaic of media files on a user interface of a computing device, the method comprising:
    receiving a set of media files from a search engine, the set of media files sorted according to a relevance ranking;
    constructing a layout in an empty space of a user interface to place one or more media files from the set of media files, the layout having a layout width determined by the user interface;
    placing a first media file from the set of media files at a top left corner of the layout in a first row;
    adjusting a height of the first row in the layout based on a width of the first row and an aspect ratio of the first media file;
    cropping the first media file horizontally to fill a selected width of the first row within a cropping tolerance;
    cropping the first media file vertically and scaling the first media file to fill the selected width of the first row within the cropping tolerance;
    selecting a second media file from the set of media files based on the relevance ranking and a size of the second media file;
    placing the second media file in a bottom right corner of the layout;
    returning the first media file to an image buffer when the layout is complete and the width of the first row exceed the cropping tolerance;
    removing the first media file from the image buffer when a number of media files returned to the image buffer is less than a rejection threshold; and
    displaying the layout when the number of media files returned to the image buffer exceeds the rejection threshold, wherein:
    the relevance ranking of the first media file is higher than the of the second media file, and
    the cropping tolerance is a value selected based on an acceptable deformation of the first media file.

2. The method of claim 1, wherein adjusting the height of the first row comprises adjusting the height of the first row lower than a height of the layout.

3. The method of claim 2, wherein placing the second media file comprises placing the second media file in a closed rectangle formed between a trailing edge adjacent to a leading edge formed by a vertical edge in the first media file.

4. The method of claim 2, further comprising verifying that the first row is wider than the layout width to within the crop tolerance to adjust the height of the first row.

5. The method of claim 2, further comprising verifying that a size of at least one media file in the first row is greater than a size limitation for the layout.

6. The method of claim 1, wherein placing the second media file comprises filling an open rectangle formed adjacent to a leading edge of an additional media file placed on the layout in a fill direction relative to the first media file.

7. The method of claim 1, further comprising adjusting a height of a second row in the layout, wherein a width of the second row is less than the layout width, and the second row includes an additional media file.

8. The method of claim 1, further comprising adjusting a size of each media file in the first row so that the height of the first row is uniform.

9. The method of claim 1, wherein a length of the first row is longer than the layout width but within a crop tolerance, the method further comprising horizontally cropping each media file in the first row so that a width of the first row is less than the layout width.

10. The method of claim 1, wherein adjusting a height of a first row comprises resizing a media file in the first row to fill the layout width while maintaining the aspect ratio of the media file.

11. A system for displaying a dynamic mosaic of media files on a user interface of a computing device, the system comprising:
    a memory storing an instruction; and
    one or more processors configured to execute the instruction to cause the system to:

receive a set of media files from a search engine, the set of media files sorted according to a relevance ranking;

construct a layout in an empty space of a user interface to place one or more media files from the set of media files, the layout having a layout width determined by the user interface;

place a first media file from the set of media files at a top left corner of the layout in a first row;

adjust a height of the first row in the layout based on a width of the first row and an aspect ratio of the first media file;

crop the first media file horizontally to fill a selected width of the first row within a cropping tolerance;

crop the first media file vertically and scaling the first media file to fill the selected width of the first row within the cropping tolerance;

select a second media file from the set of media files based on the relevance ranking and a size of the second media file;

place the second media file in a bottom right corner of the layout;

return the first media file to an image buffer when the layout is complete and the width of the first row exceed the cropping tolerance;

remove the first media file from the image buffer when a number of media files returned to the image buffer is less than a rejection threshold; and display the layout when the number of media files returned to the image buffer exceeds the rejection threshold, wherein:

the relevance ranking of the first media file is higher than the of the second media file, and the cropping tolerance is a value selected based on an acceptable deformation of the first media file.

12. The system of claim 11, wherein to adjust the height of the first row the one or more processors execute instructions to adjust the height of the first row below a height of the layout.

13. The system of claim 11, wherein to place the second media file the one or more processors execute instructions to place the second media file in a closed rectangle formed between a trailing edge adjacent to a leading edge formed by a vertical edge in the first media file.

14. The system of claim 11, wherein the one or more processors further execute instructions to verify that the first row is wider than the layout width to within a crop tolerance to adjust the height of the first row.

15. The system of claim 11, wherein the one or more processors further execute instructions to verify that a size of at least one media file in the first row is greater than a size limitation for the layout.

16. The system of claim 11, wherein to place the second media file the one or more processors execute instructions to fill an open rectangle formed adjacent to a leading edge of an additional media file placed on the layout in a fill direction relative to the first media file.

17. The system of claim 11, wherein the one or more processors further execute instructions to adjust a height of a second row in the layout, wherein a width of the second row is less than the layout width, and the second row includes an additional media file.

18. The system of claim 11, wherein the one or more processors further execute instructions to adjust a size of each media file in the first row so that the height of the first row is uniform.

19. The system of claim 11, wherein a length of the first row is longer than the layout width but within a crop tolerance, and the one or more processors further execute instructions to horizontally crop each media file in the first row so that a width of the first row is less than the layout width.

20. The system of claim 11, wherein to adjust a height of a first row the one or more processors execute instructions to resize a media file in the first row to fill the layout width while maintaining the aspect ratio of the media file.

\* \* \* \* \*